US009589846B1

(12) United States Patent
Tsai et al.

(10) Patent No.: US 9,589,846 B1
(45) Date of Patent: Mar. 7, 2017

(54) METHOD OF FORMING SEMICONDUCTOR DEVICE

(71) Applicant: UNITED MICROELECTRONICS CORP., Hsin-Chu (TW)

(72) Inventors: Fu-Yu Tsai, Tainan (TW); Wei-Hsin Liu, Changhua County (TW); Han-Sheng Huang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/006,053

(22) Filed: Jan. 25, 2016

(51) Int. Cl.
 *H01L 21/82* (2006.01)
 *H01L 21/8234* (2006.01)
 *H01L 29/66* (2006.01)

(52) U.S. Cl.
 CPC ........ *H01L 21/823462* (2013.01); *H01L 29/66545* (2013.01)

(58) Field of Classification Search
 CPC ................ H01L 21/823462; H01L 21/00
 See application file for complete search history.

(56) References Cited

U.S. PATENT DOCUMENTS

| | | | | |
|---|---|---|---|---|
| 5,502,009 A * | 3/1996 | Lin | ........ | H01L 21/823462 257/E21.625 |
| 6,368,923 B1 * | 4/2002 | Huang | ........ | H01L 21/823462 257/E21.623 |
| 6,372,605 B1 * | 4/2002 | Kuehne | ........ | H01L 21/76229 257/510 |
| 6,621,951 B1 * | 9/2003 | Zhao | ........ | G02B 6/30 385/15 |
| 7,157,378 B2 * | 1/2007 | Brask | ........ | H01L 21/28185 257/E21.444 |
| 8,846,475 B2 | 9/2014 | He | | |
| 9,034,714 B2 * | 5/2015 | Won | ........ | H01L 21/823462 257/E21.336 |
| 2002/0061659 A1 * | 5/2002 | Abe | ........ | C23C 16/345 438/791 |
| 2003/0008492 A1 * | 1/2003 | Jung | ........ | H01L 21/02164 438/624 |
| 2004/0043581 A1 * | 3/2004 | Lin | ........ | H01L 21/76229 438/437 |
| 2005/0014352 A1 * | 1/2005 | Torii | ........ | H01L 21/823462 438/591 |
| 2010/0048028 A1 * | 2/2010 | Rasheed | ........ | C23C 16/4404 438/758 |
| 2013/0078792 A1 * | 3/2013 | Huang | ........ | H01L 21/28088 438/591 |
| 2015/0008488 A1 * | 1/2015 | Hall | ........ | H01L 29/66636 257/288 |
| 2016/0086882 A1 * | 3/2016 | Lee | ........ | H01L 23/535 257/773 |

* cited by examiner

*Primary Examiner* — Scott B Geyer
*Assistant Examiner* — S. M. S Imtiaz
(74) *Attorney, Agent, or Firm* — Winston Hsu; Scott Margo

(57) ABSTRACT

A method for forming a semiconductor device is provided. First, a dielectric layer is provided on a substrate, wherein a first recess and a second recess are formed in the dielectric layer. After a mask layer is filled into the first recess and the second recess, the mask layer in the second recess is removed away, thereby forming a patterned mask layer. Subsequently, a nitride treatment is performed to remove unwanted residue of the mask layer in the second recess.

20 Claims, 5 Drawing Sheets

METHOD OF FORMING SEMICONDUCTOR DEVICE

BACKGROUND OF THE INVENTION

1. Field of the Invention

The present invention relates to a method of fabricating a semiconductor device, and more particularly, to a method of simultaneously forming a high-voltage device and a low-voltage device.

2. Description of the Prior Art

With a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals that are suitable for use as the high-k gate dielectric layer are used to replace the conventional poly-silicon gate to be the control electrode.

The conventional metal gate methods are categorized into gate first processes and gate last processes. In a conventional gate first process, the annealing process for forming the source/drain ultra-shallow junction, and the silicide process are performed after forming the metal gate. In the conventional gate last process, a sacrificial gate or a replacement gate is provided and followed by performing processes used to construct a normal MOS transistor. Then, the sacrificial/replacement gate is removed to form a gate trench. Consequently, the gate trench is filled with metals according to the different electrical requirements. However, because of the complicated steps of the gate last processes, the manufacturers are devoted to simplifying the manufacturing process.

Moreover, integrated circuits (ICs) containing both high-voltage and low-voltage devices such as high/low voltage MOS transistor devices are known in the art. For example, the operation voltage of the low-voltage device is about 0.9V and the operation voltage of the high-voltage device is about 1.8V. In general, the high-voltage device requires a thicker gate dielectric layer. Nevertheless, whether in gate first processes or gate last processes, the requirement to simultaneously form the high-voltage device with thicker gate dielectric layer and the low-voltage device with thinner gate dielectric layer is seldom considered.

SUMMARY OF THE INVENTION

The present invention therefore provides a method of fabricating a semiconductor device, and more particularly, a method of simultaneously forming a high-voltage transistor and a low-voltage transistor.

According to one embodiment, the method for forming a semiconductor device is provided. First, a dielectric layer is provided on a substrate, wherein a first recess and a second recess are formed in the dielectric layer. After a mask layer is filled into the first recess and the second recess, the mask layer in the second recess is removed away, thereby forming a patterned mask layer. Subsequently, a nitride treatment is performed to remove unwanted residue of the mask layer in the second recess.

The method set for the in the present invention is characterized that there is no oxygen treatment performed after exposing the second trench and before forming the third sacrificial layer. Thus, the second spacer aside the second trench is not oxidized and is not removed when thinning the first interfacial layer. The trench width of the device can therefore be kept and a reliable device can be obtained.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Please refer to FIG. 1 to FIG. 9, showing schematic diagrams of the method for forming a semiconductor device according to one embodiment of the present invention. Please refer to FIG. 1, a substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, are also suitable for the semiconductor substrate 300. A first region 400 and a second region 500 are defined on the substrate 300. In one preferred embodiment, the first region 400 is a high-voltage device region such as an input/output region which contains high-voltage (18V or even higher for example) MOS transistors. The second region 500 is a low-voltage region such as a core region which contains low-voltage (0.9V or lower for example) MOS transistors. A shallow trench isolation (STI) 302 is formed simultaneously or respectively in the first region 400 and the second region 500, encompassing and defining the active regions (not shown) where the high voltage transistor and the low voltage transistor will be formed. Next, a first transistor (referred as a high voltage transistor) 402 and a second transistor (referred as a low voltage transistor) 502 are formed on the substrate 300 of the first region 400 and the second region 500, respectively.

Figure 1:
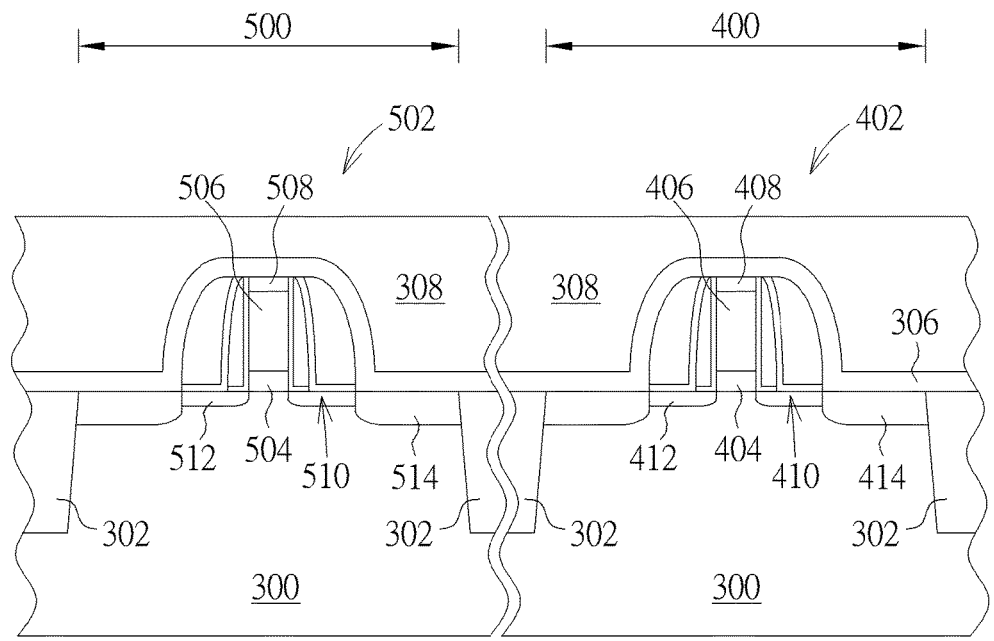
FIG. 1 shows a schematic diagram of forming a first transistor and a second transistor in the method of forming a semiconductor device according to one embodiment of the present invention.

As shown in FIG. 1, the first transistor 402 includes a first oxide layer 404, a first sacrifice gate 406, a first capping layer 408, a first spacer 410, a first lightly doped drain (LDD) 412 and a first source/drain 414. In one preferred embodiment of the present invention, the first oxide layer 404 directly contacts the substrate 300 and the material thereof contains oxide. In one embodiment, it is $SiO_2$ formed by a thermal oxidization process. In another embodiment, the first oxide layer 404 can be made of high-k dielectric material having a dielectric constant greater than 4, which is formed by chemical vapor deposition (CVD) process for example. The high-k dielectric material includes rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The first sacrificial gate 406 is a poly-silicon gate. In another embodiment, the first sacrificial gate 406 is a multi-layered gate including a poly-silicon layer, an amorphous silicon layer or a germanium layer. The first capping layer 408 is a SiN layer for example. The first spacer 410 is a single layer including SiN or SiCN, or can be a multi-layered structure including high temperature oxide (HTO), SiN, $SiO_2$, SiCN or SiN formed by hexachlorodisilane ($Si_2Cl_6$) (HCD-SiN). When the first spacer 410 is composed of multi-layers, it is preferably that the side portion adjacent to the first sacrificial gate 406 is composed of nitrogen, such as SiN or SiCN. The first LDD 412 and the first source/drain 414 are formed by appropriate implant doping.

The second transistor 502 includes a second oxide layer 504, a second sacrifice gate 506, a second capping layer 508, a second spacer 510, a second LDD 512 and a second source/drain 514. In one preferred embodiment, the first transistor 402 and the second transistor 502 have similar components formed in the same fabricating method. Taking the oxide layer for example, the first oxide layer 404 and the second oxide layer 504 can be formed simultaneously by a thermal oxidation process and thus the first oxide layer 404 and the second oxide layer 504 both contain $SiO_2$ and have the same thickness (30 angstroms for example). The embodiment of each component in the second transistor 502 is similar to that of the first transistor 402 and is not described repeatedly. In one embodiment, the first transistor 402 or the second transistor 502 can further include other semiconductor structures which are not explicitly shown in FIG. 1, such as a silicide layer. After forming the first transistor 402 and the second transistor 502, a contact etch stop layer (CESL) 306 and an inter-layer dielectric (ILD) layer 308 are formed on the substrate 300 to cover the first transistor 402 and the second transistor 502.

Figure 2:
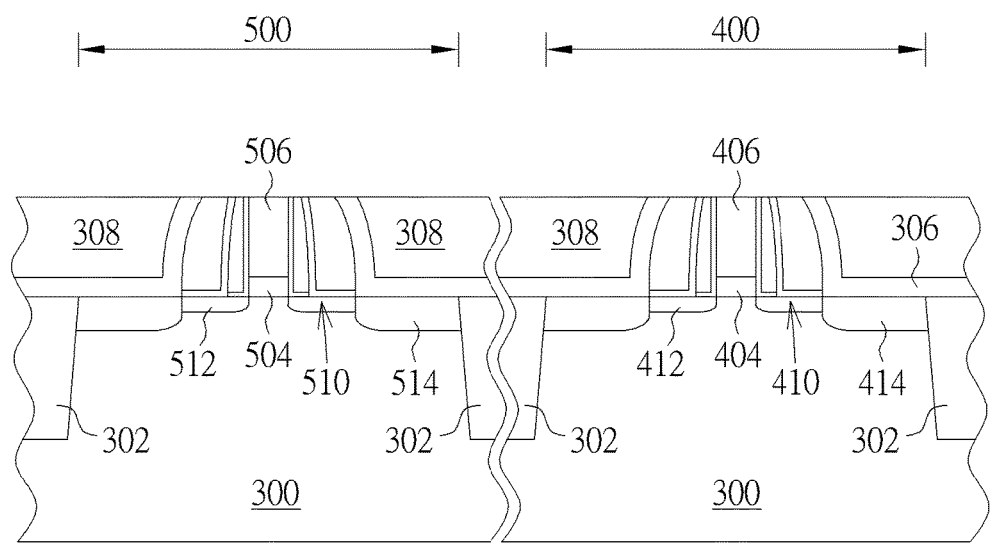
FIG. 2 shows a schematic diagram of performing a planarization process in the method of forming a semiconductor device according to one embodiment of the present invention.

As shown in FIG. 2, a planarization process, such as a chemical mechanical polish (CMP) process or an etching-back process is performed to remove a part of the ILD layer 308, a part of the CESL 306, a part of the first spacer 410, a part of the second spacer 510, and completely remove the first capping layer 408 and the second capping layer 508, until the top surface of the first sacrifice gate 406 and the second sacrifice gate 506 are exposed.

Figure 3:
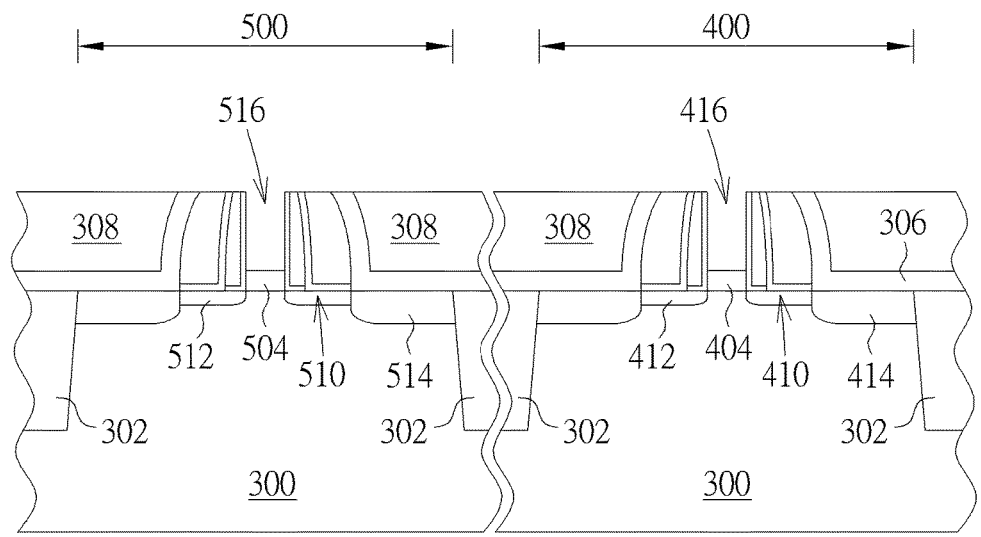
FIG. 3 shows a schematic diagram of forming a first trench and a second trench in the method of forming a semiconductor device according to one embodiment of the present invention.

As shown in FIG. 3, an etching process is performed to remove the first sacrifice gate 406 and the second sacrifice gate 506 to respectively form a first trench 416 and the second trench 516 in the first transistor 402 and in the second transistor 502. The etching process includes a dry etching process and/or a wet process. For example, the dry etching process uses an etchant including HBr, $N_2$ or $NF_3$ or uses an etchant including $BCl_3$ while the wet etching uses tetramethyl ammonium hydroxide (TMAH). In another embodiment, the etching recipe of the etching process can be adjusted according to the materials of the first sacrifice gate 406 and the second sacrifice gate 506. The etching process stops on the first oxide layer 404 and the second oxide layer 504. Thus, the exposed first oxide layer 404 and the exposed first spacer 410 confine the first trench 416 and the exposed second oxide layer 504 and the second spacer 510 confine the second trench 516.

Figure 4:
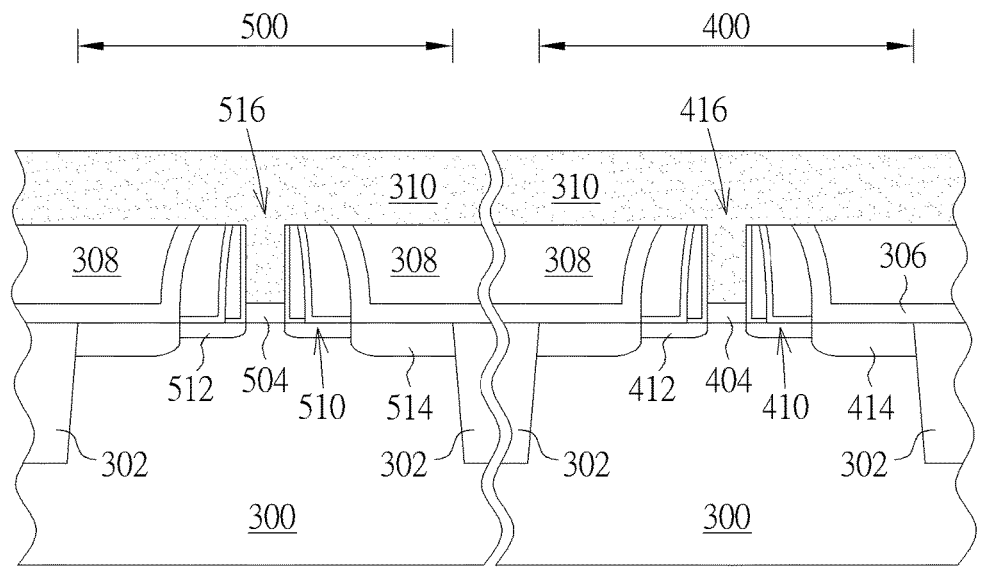
FIG. 4 shows a schematic diagram of forming a mask layer in the method of forming a semiconductor device according to one embodiment of the present invention.

As shown in FIG. 4, a mask layer 310 is formed on the substrate 300, filling into the first trench 416 and the second trench 516 simultaneously. The mask layer 310 has an etching selectivity with respect to the second oxide layer 504 (and the first oxide layer 404). In one embodiment, the mask layer 310 includes an organic material with good filling ability, such as spin-on glass (SOG), bottom anti-reflective coating (BARC layer), or photoresist layer. In another embodiment, the mask layer 310 can be other mask material such as silicon nitride (SiN), silicon carbide (SiC), silicon oxynitride (SiON), poly-silicon, advanced pattern film (APF) supplied by the Applied Materials company, or combinations thereof, but is not limited thereto. In one preferred embodiment, the mask layer 310 is a photoresist.

Figure 5:
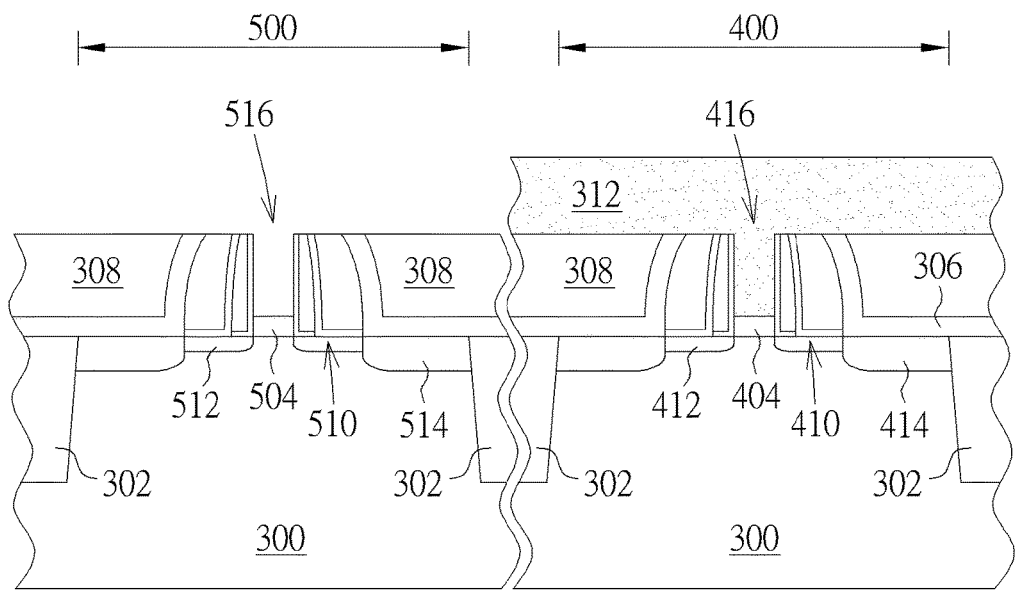
FIG. 5 shows a schematic diagram of forming a patterned mask layer in the method of forming a semiconductor device according to one embodiment of the present invention.

As shown in FIG. 5, a patterning process is performed to remove the mask layer 310 in the second recess 516, thereby forming a patterned mask layer 312. The patterned mask layer 312 therefore exposes the second trench 516 as well as the second oxide layer 504 inside. When the mask layer 310 is formed of photoresist, the patterning process can be a lithography/development process. When the mask layer 310 is other material, appropriate patterning process can be performed depending on the material of the mask layer 310.

Figure 6:
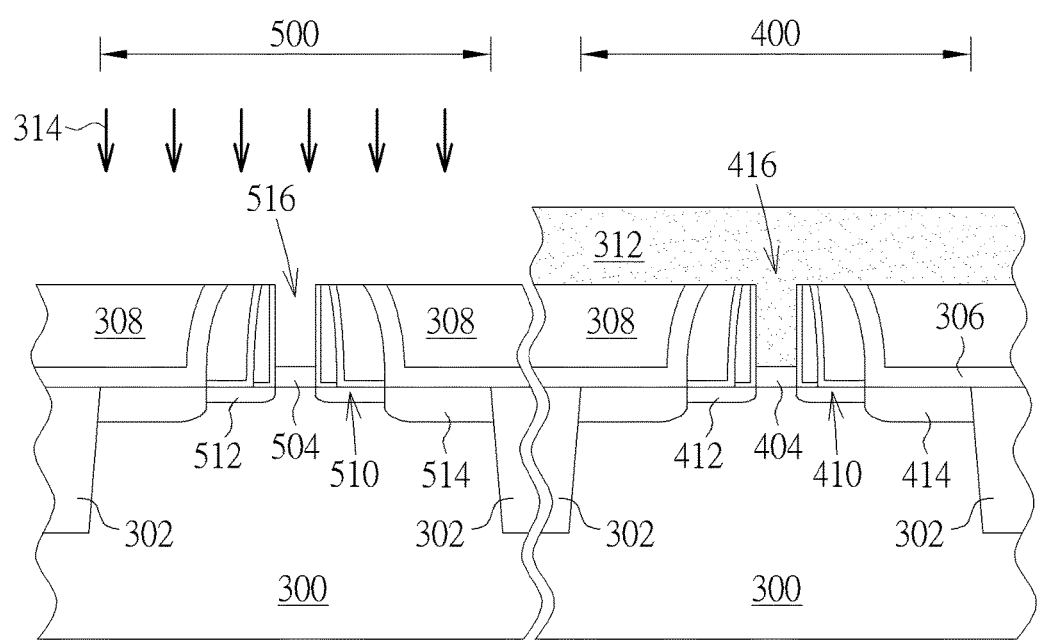
FIG. 6 shows a schematic diagram of removing a part of the first interfacial layer in the method of forming a semiconductor device according to one embodiment of the present invention.

As shown in FIG. 6, a cleaning process 314 is performed. After the patterning process in FIG. 5 is performed, there might be some organic residues remained in the second trench 516, thus affecting the following steps performed for the second trench 516. The present invention therefore provides the cleaning process 314 for removing unwanted residue of the mask layer 310 in the second recess 516. In this embodiment, the cleaning process 314 is a nitride treatment. Preferably, the nitride treatment is carried out by using plasma with supplying nitrogen gas (N₂).

Figure 7:
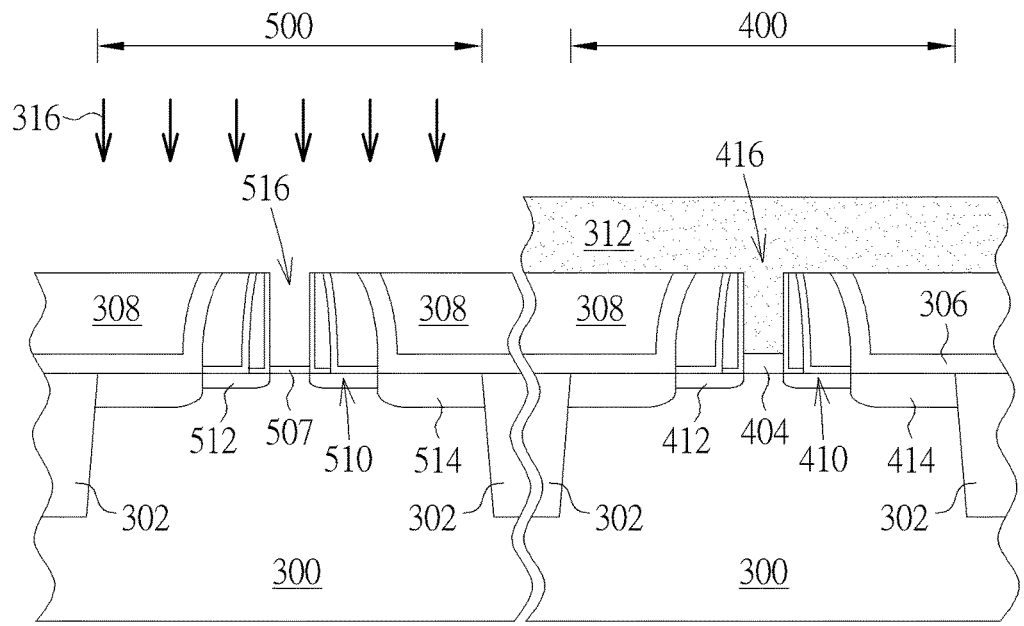
FIG. 7 shows a schematic diagram of removing the patterned mask layer in the method of forming a semiconductor device according to one embodiment of the present invention.

Next, as shown in FIG. 7, another etching process 316 is performed to remove a part of the second oxide layer 504 to deepen the second trench 516, and a thinner third oxide layer 507 is formed in the second recess 516. In one embodiment, the etching process 316 includes using etching gas such as NH₃ and HF. Preferably, the etching process 316 does not use plasma. Since the present embodiment uses nitrogen treatment, instead of oxygen treatment to serve as the cleaning process 314 (as shown in FIG. 6), the second spacer 510 adjacent to the second trench 516 is not oxidized. Thus, when performing the etching process 316 to remove the second oxide layer 504 which is composed of oxide, the second spacer 510 is not removed. Accordingly, the second recess 516 is not enlarged and the fine recess width of the second recess 516 can be maintained. In another embodiment, the etching process 316 can completely remove the second oxide layer 504 to expose the substrate 300. Then, a new third oxide layer 507 is formed. Preferably, the formed third oxide layer 507 is thinner than the first oxide layer 404. After forming the third oxide layer 507, the patterned mask layer 312 is completely removed by using a chemical oxide agent for example.

Figure 8:
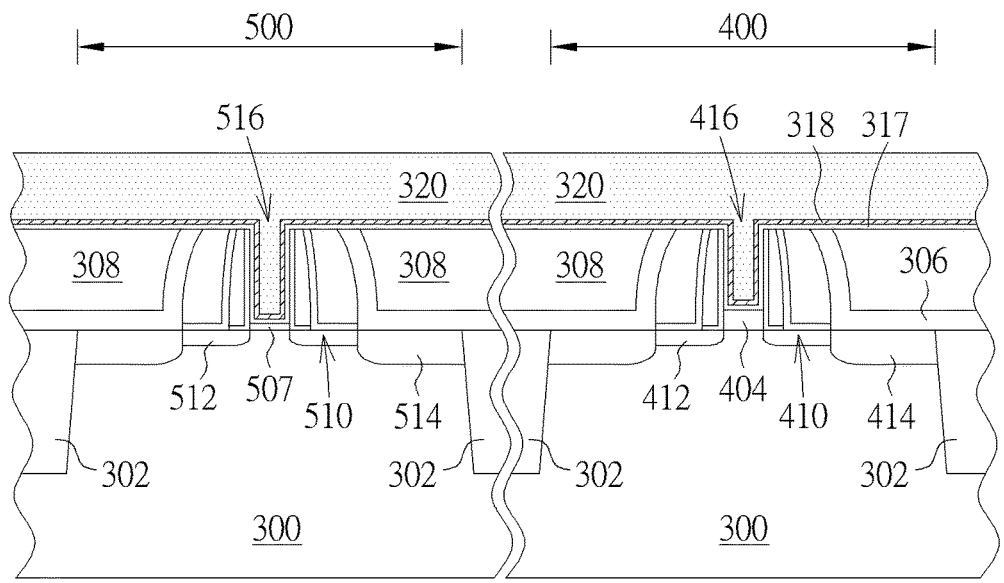
FIG. 8 shows a schematic diagram of forming a plurality of metal layers in the first trench and the second trench in the method of forming a semiconductor device according to one embodiment of the present invention.

As shown in FIG. 8, a high-k dielectric layer 317, a work function metal layer 318 are formed on the substrate 300 to conformally fill into the first trench 416 and the second trench 516. The first trench 416 and the second trench 516 are not completely filled with the work function metal layer 318. Subsequently, a low-resistive metal layer 320 is formed on the substrate 300 to completely fill into the first trench 416 and the second trench 516. The high-k dielectric layer 317 includes the above mentioned high-k material. The material of the work function metal layer 318 depends on the electrical property of the second transistor 502, for example, the work function metal layer 318 can include TiAl, ZrAl, WAl, TaAl, HfAl, TiN or TaC, but is not limited thereto. The low-resistive metal layer 320 includes Al, Ti, Ta, W, Nb, Mo, Cu, TiN, TiC, TaN Ti/W or Ti/TiN, but is not limited thereto. In one embodiment, a single or a plurality barrier layers such as a TiN layer or a TaN layer can be formed between the high-k dielectric layer 317 and the work function metal layer 318, or between the work function metal layer 318 and the low-resistive metal layer 320.

Figure 9:
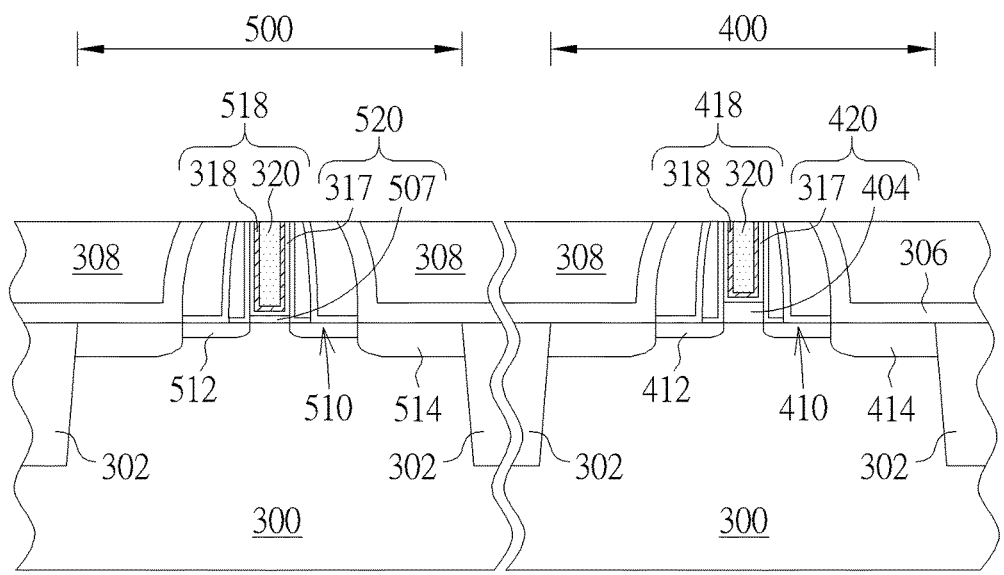
FIG. 9 shows a schematic diagram of performing a planarization process in the method of forming a semiconductor device according to one embodiment of the present invention.

As shown in FIG. 9, a planarization process is performed to simultaneously remove the high-k dielectric layer 317, the work function metal layer 318 and the low-resistive metal layer 320 outside the first trench 416 and the second trench 516. Thus, the high-k dielectric layer 317 and the work function metal layer 318 form a U-shaped cross-section in the first trench 416 and the second trench 516. The work function metal layer 318 and the low-resistive metal layer 320 in the first trench 416 together form a first metal gate 418 of the first transistor 402. The high-k dielectric layer 317 and the first oxide layer 404 together form the first gate dielectric layer 420 of the first transistor 402. In the meanwhile, the work function metal layer 318 and the low-resistive metal layer 320 in the second trench 516 together form a second metal gate 518 of the second transistor 502. The high-k dielectric layer 317 and the third oxide layer 507 together form the second gate dielectric layer 520 of the second transistor 502. It is noted that the first transistor 402 contains a first gate dielectric layer 420 which is thicker than the second gate dielectric layer 520 of the second transistor 502. The first transistor 420 is operated under a voltage greater or equal to 18V. Thus, the semiconductor device with a high voltage transistor (first transistor 402) and a low voltage transistor (second transistor 502) can be fabricated.

In this embodiment, it is characterized that the cleaning process 314 uses nitride treatment to remove the residue of the mask layer 310, and there is no oxygen treatment performed after exposing the second trench 516 and before forming the third oxide layer 507. The second spacer 510 aside the second trench 516 is not oxidized and is not removed when thinning the first oxide layer 504.

In another embodiment, the fabrication sequence of thinning the first oxide layer 504 (FIG. 6) and cleaning process (FIG. 7) can be interchanged. That is, after forming the patterned mask layer 312 to expose the second trench 516 (FIG. 5), the etching process 316 is performed to form the thinner third oxide layer 507 (FIG. 7). Then, the cleaning process 314 is performed (FIG. 6). Since the cleaning process 314 is performed after the etching process 316, the cleaning process 314 is restricted to nitride treatment and can also be oxygen treatment.

Moreover, the above method shown in a gate-last process can also be applied in a gate-first process. Besides, the above method shows forming the high-k gate dielectric layer after removing the sacrificial gate (namely, the high-k last process). Those skilled in the art can realize that it is also possible to form the high-k layer before removing the sacrificial gate (namely, the high-k first process). In the high-k first process, the first oxide layer and the second oxide layer can be made of high-k material and thus itself serves as the gate dielectric layer. Thus, there is no need to form another high-k dielectric layer. In another embodiment, the first transistor 402 and the second transistor 502 can be non-planar transistors such as Fin-FET and is not limited to the planar transistor shown above.

In light of above, the present invention provides a method of forming a semiconductor device with a high-voltage transistor and a low-voltage transistor. It is characterized that there is no oxygen treatment performed after exposing the second trench and before forming the third oxide layer. Thus, the second spacer aside the second trench is not oxidized and is not removed when thinning the first oxide layer. The trench width of the device can therefore be kept.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a dielectric layer on a substrate, wherein a first recess and a second recess are formed in the dielectric layer;
   after forming the first recess and the second recess in the dielectric layer, forming a mask layer filling into the first recess and the second recess;
   removing the mask layer in the second recess, thereby forming a patterned mask layer; and
   performing a nitride treatment for removing unwanted residue of the mask layer in the second recess.

2. The method of forming a semiconductor device according to claim 1, wherein the mask layer comprises an organic material.

3. The method of forming a semiconductor device according to claim 1, wherein the mask layer is a photoresist.

4. The method of forming a semiconductor device according to claim 1, wherein the mask layer comprises silicon nitride (SiN), silicon carbide (SiC), silicon oxynitride (SiON) or advanced pattern film (APF).

5. The method of forming a semiconductor device according to claim 1, wherein the nitride treatment comprises using plasma.

6. The method of forming a semiconductor device according to claim 1, further comprising:
forming a second oxide layer on the substrate, wherein the step of forming the second recess exposes the second oxide layer.

7. The method of forming a semiconductor device according to claim 6, further comprising:
after performing the nitride treatment, removing at least a part of the second oxide layer to deepen the second recess.

8. The method of forming a semiconductor device according to claim 6, wherein after exposing the second recess and before removing a part of the second oxide layer, there is no oxygen treatment for the second recess.

9. The method of forming a semiconductor device according to claim 7, wherein the second oxide layer is removed by a dry etching.

10. The method of forming a semiconductor device according to claim 9, wherein the dry etching comprises using NH3 and HF.

11. The method of forming a semiconductor device according to claim 6, further comprising:
before performing the nitride treatment, removing at least a part of the second oxide layer to deepen the second recess.

12. The method of forming a semiconductor device according to claim 6, further comprising:
forming a first oxide layer on the substrate, wherein the step of forming the first recess exposes the first oxide layer.

13. The method of forming a semiconductor device according to claim 12, wherein before forming the mask layer, the first oxide layer has a first thickness substantially equal to a second thickness of the second oxide layer.

14. The method of forming a semiconductor device according to claim 1, further comprising:
forming a second spacer on the substrate, wherein the step of forming the second recess exposes a sidewall of the second spacer.

15. The method of forming a semiconductor device according to claim 14, wherein after exposing the second recess, the sidewall of the second spacer is not oxidized.

16. The method of forming a semiconductor device according to claim 14, further comprising:
forming a first spacer on the substrate, wherein the step of forming the first recess exposes a sidewall of the first spacer.

17. The method of forming a semiconductor device according to claim 1, further comprising:
completely removing the patterned mask layer.

18. The method of forming a semiconductor device according to claim 17, wherein the patterned mask layer is removed by using a chemical oxide agent.

19. The method of forming a semiconductor device according to claim 17, wherein after removing the patterned mask layer, further comprising:
forming a first metal gate in the first recess and forming a second metal gate in the second recess.

20. The method of forming a semiconductor device according to claim 1, wherein the first recess is an input/output region and the second recess is a core region.

* * * * *